(12) United States Patent
Fujiki et al.

(10) Patent No.: US 10,168,389 B2
(45) Date of Patent: Jan. 1, 2019

(54) ALL-SOLID SECONDARY BATTERY, METHOD OF CONTROLLING ALL-SOLID SECONDARY BATTERY AND METHOD OF EVALUATING ALL-SOLID SECONDARY BATTERY

(71) Applicant: Samsung Electronics Co., Ltd., Suwon-s, Gyeonggi-Do (KR)

(72) Inventors: Satoshi Fujiki, Yokohama (JP); Takanobu Yamada, Yokohama (JP); Yuichi Aihara, Yokohama (JP); Naoki Suzuki, Yokohama (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 270 days.

(21) Appl. No.: 14/818,626

(22) Filed: Aug. 5, 2015

(65) Prior Publication Data

US 2016/0043392 A1 Feb. 11, 2016

(30) Foreign Application Priority Data

Aug. 6, 2014 (JP) ................................. 2014-160860
Mar. 20, 2015 (KR) ........................ 10-2015-0038955

(51) Int. Cl.
*H01M 4/13* (2010.01)
*G01R 31/36* (2006.01)
(Continued)

(52) U.S. Cl.
CPC ........ *G01R 31/3679* (2013.01); *H01M 4/366* (2013.01); *H01M 4/587* (2013.01);
(Continued)

(58) Field of Classification Search
CPC ......... H01M 10/0525; H01M 10/0562; H01M 10/44; H01M 4/624; H01M 4/366; H01M 4/587; H01M 4/133; H01M 2300/0068
See application file for complete search history.

(56) References Cited

U.S. PATENT DOCUMENTS 8,088,514 B2  1/2012 Takami et al.
8,137,845 B2  3/2012 Kim et al.
(Continued)

FOREIGN PATENT DOCUMENTS

CN  103560267 A  2/2014
EP  1923935 A1  5/2008
(Continued)

OTHER PUBLICATIONS

English translation of JP2012049001 2017.*
Japanese Office Action for Japanese Patent Application No. 2014-160860 dated Jun. 14, 2018, with English translation.

*Primary Examiner* — Jane J Rhee
(74) *Attorney, Agent, or Firm* — Cantor Colburn LLP (57) ABSTRACT

A lithium ion secondary battery including a cathode layer, an anode layer including an anode active material and a coating including a metal element, wherein the coating is disposed on the anode active material; and a solid electrolyte layer disposed between the cathode layer and the anode layer, wherein the coating has an electrochemical reaction potential with lithium that is greater than an electrochemical reaction potential of the anode active material with lithium.

19 Claims, 4 Drawing Sheets

(51) Int. Cl.

| | | |
|---|---|---|
| *H01M 10/0525* | (2010.01) | |
| *H01M 4/62* | (2006.01) | |
| *H01M 10/0562* | (2010.01) | |
| *H01M 4/36* | (2006.01) | |
| *H01M 4/587* | (2010.01) | |
| *H01M 10/44* | (2006.01) | |
| *H01M 4/133* | (2010.01) | |
| *H02J 7/00* | (2006.01) | |

(52) U.S. Cl.
CPC ....... *H01M 4/624* (2013.01); *H01M 10/0525* (2013.01); *H01M 10/0562* (2013.01); *H01M 10/44* (2013.01); *H01M 4/133* (2013.01); *H01M 2300/0068* (2013.01); *H02J 7/0029* (2013.01); *H02J 2007/004* (2013.01)

(56) References Cited

U.S. PATENT DOCUMENTS

2010/0151331 A1* 6/2010 Sun .................. H01M 4/1391 429/231.95
2014/0093783 A1* 4/2014 Lamanna .......... H01M 10/0525 429/300
2014/0093786 A1* 4/2014 Ito .......................... H01M 4/62 429/322
2014/0329118 A1 11/2014 Nagase et al.

FOREIGN PATENT DOCUMENTS

| | | |
|---|---|---|
| JP | 11-310405 A | 11/1999 |
| JP | 2003-123740 A | 4/2003 |
| JP | 2005-285647 A | 10/2005 |
| JP | 2005353309 A | 12/2005 |
| JP | 2006-12761 A | 1/2006 |
| JP | 2006-107812 A | 4/2006 |
| JP | 2006-269345 A | 10/2006 |
| JP | 2008-300148 A | 12/2008 |
| JP | 2010-73544 A | 4/2010 |
| JP | 2012-49001 A | 3/2012 |
| JP | 2013-65453 A | 4/2013 |
| JP | 2013089423 A | 5/2013 |
| KR | 1020140022253 A | 2/2014 |
| KR | 1020140036660 A | 3/2014 |
| WO | 2013084302 A1 | 6/2013 |

* cited by examiner

ALL-SOLID SECONDARY BATTERY, METHOD OF CONTROLLING ALL-SOLID SECONDARY BATTERY AND METHOD OF EVALUATING ALL-SOLID SECONDARY BATTERY

CROSS-REFERENCE TO RELATED APPLICATIONS

This application claims priority to and the benefit of Japanese Patent Application No. 2014-0160860, filed on Aug. 6, 2014, and Korean Patent Application No. 10-2015-0038955, filed on Mar. 20, 2015, in the Korean Intellectual Property Office, the contents of which are incorporated herein in their entirety by reference.

BACKGROUND

1. Field

The present disclosure relates to a lithium ion secondary battery.

2. Description of the Related Art

A lithium ion secondary battery can include a sulfide having good lithium ion conductivity as an inorganic solid electrolyte to provide a structure containing electrodes (a cathode and an anode) formed on two surfaces of a solid electrolyte layer and a current collector connected to each of the electrodes.

In the lithium ion secondary battery, graphite can be used as an anode active material since graphite is capable of intercalating and deintercalating lithium ions and may have a high capacity. Japanese Patent No. 2008-300148 is related to a lithium secondary battery having improved electrical conductivity by adhering particles of a transition metal that does not form an alloy with lithium on a surface of an anode active material that is formed of a carbonaceous material and using a polymer electrolyte as a solid electrolyte.

Japanese Patent No. 1999-310405 discloses graphite coated with a graphite or pitch for coating, and using the coated graphite as an anode of a lithium ion battery. Also, Japanese Patent No. 2012-049001 is related to an inorganic all-solid secondary battery including an anode active material formed of graphite and coated with amorphous carbon to decrease lithium ion conduction resistance of an anode.

Japanese Patent No. 2006-107812 is related to an inorganic solid electrolyte secondary battery that may have good battery characteristics by including a cathode, an anode, and an inorganic solid electrolyte, wherein the cathode includes a cathode active material layer and a cathode current collector layer, the anode includes an anode active material layer and an anode current collector layer, the cathode current collector layer and the anode current collector layer are a conductive metal oxide layer, and the anode active material layer is formed of a material having an operating voltage that is higher than 1.0 V vs. Li.

In order to detect a charge/discharge state of an inorganic all-solid secondary battery including a sulfide-based solid electrolyte, as disclosed in Japanese Patent No. 2005-285647, in a lithium ion battery, a pressure sensor overlaps the lithium ion battery, and a sandwiching member that sandwiches the lithium ion battery and the pressure sensor at both sides in an overlapped direction. Further, when the lithium secondary battery expands or contracts by charging/discharging of the battery, force loaded on the pressure sensor changes accordingly, and thus the volume change of the lithium ion battery is detected as an output value of the pressure sensor.

Japanese Patent No. 2006-012761 is related to a state estimation system of a secondary battery that includes a cathode and an anode, wherein each of the cathode and the anode are included in a case in a secondary battery. Further, a temperature sensor is disposed between restraining plates and thus is integrated with a secondary battery cell as one body. This temperature sensor is disposed in a manner to detect temperatures of the cathode and the anode with respect to at least one of the secondary batteries. An electronic control unit (ECU) outputs a state of charge (SOC) of the secondary battery according to a pressure detection value of the pressure sensor and a temperature detection value of the temperature sensor with consideration of a fact that volume change characteristics of electrodes change according to temperature change.

An overvoltage detection device disclosed in Japanese Patent No. 2006-269345 includes laminate, stacked in a thickness direction, covered batteries as lithium ion batteries, and pressure sensors that are inserted between laminate surfaces of the adjacent laminate covered batteries. Further, the pressure sensor measures a surface pressure (a contact pressure) applied on the laminate surface and determines whether overvoltage occurred in the laminate covered batteries by detecting whether the measured contact pressure is higher than a critical value or not.

Japanese Patent No. 2010-073544 is related to a battery unit including a solid battery, an accommodation case that accommodates the solid battery, a loading sensor installed on the accommodation case, and a sandwiching member that sandwiches the accommodation case and the loading sensor to detect accurate state of charge (SOC) of the battery unit.

Further, Japanese Patent No. 2013-065453 is related to a lithium ion battery capable of setting a discharge cut-off voltage, wherein a relationship between a potential of a cathode and a capacity of a cathode during discharging of the battery sets the discharge cut-off voltage, wherein each of a lithium nickel oxide and a lithium iron phosphate form a composite by reversible intercalation of lithium ions, and an anode potential at a time of discharge cut-off is a potential that does not cause changes in silicon oxide under the battery voltage.

However, since a lithium ion battery has a small difference between a redox potential of lithium and a redox potential of a graphite-lithium interlayer compound when graphite is used as an anode active material, lithium dendrites have been easily formed, and fast charging of the battery has been difficult. Further, since charge/discharge state of the lithium ion battery have been detected by changes in physical properties, such as pressure or temperature, of the battery, a device structure of the lithium ion battery has been complicated. Furthermore, the lithium secondary battery disclosed in Japanese Patent No. 2006-012761 may predict the potential of the anode from the relationship between the discharge potential of the cathode and the battery capacity, but a state of the anode may not be directly detected.

SUMMARY

Provided is a lithium ion battery capable of suppressing dendrite deposition and exhibiting high rate charging characteristics regardless of an anode active material.

Provided is a lithium ion battery capable of suppressing dendrite deposition and exhibiting high rate charging characteristics as well as directly detecting a charge/discharge state of an anode without relying on information of pressure sensors.

Additional aspects will be set forth in part in the description which follows and, in part, will be apparent from the description.

According to an aspect, a lithium ion secondary battery includes a cathode layer; an anode layer including an anode active material and a coating including a metal element, wherein the coating is disposed on the anode active material; and a solid electrolyte layer disposed between the cathode layer and the anode layer, wherein the coating has an electrochemical reaction potential with lithium that is greater than an electrochemical reaction potential of the anode active material with lithium.

According to an aspect of another exemplary embodiment, a method of controlling discharge of a lithium ion secondary battery includes: monitoring a discharge curve of an anode; detecting, in a graph of voltage versus discharge capacity, a point of inflection of a discharge voltage that occurs during a discharge of between 75 percent and 100 percent a discharge capacity the anode; and completing the discharge of the anode based on the detection of the point of inflection to control the discharge of the lithium secondary battery.

According to another aspect, a method of determining battery characteristics of a lithium ion secondary battery includes: monitoring a discharge curve of an anode; detecting, in a graph of voltage versus discharge capacity, a point of inflection of the discharge voltage that occurs during a discharge of between 75 percent and 100 percent of a discharge capacity of the anode; and determining a deterioration of the anode based on the detection of the point of inflection to determine battery characteristics of the lithium ion secondary battery.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Reference will now be made in detail to exemplary embodiments of an all-solid secondary battery and a method of preparing the all-solid secondary battery, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the term "metal" refers to metallic and/or metalloid elements selected from Groups 1 to 17 the Periodic Table of Elements, including the lanthanide elements and the actinide elements.

According to an embodiment, and while not want to be bound by theory, it is understood that because a metal capable of forming a lithium compound at a potential versus lithium which is higher than a redox potential of an anode active material and lithium is coated, e.g., applied, attached or otherwise disposed on a surface of the anode active material, lithium can intercalate into the anode active material through the lithium compound of the metal, and thus deposition of dendrites may be suppressed and a battery including the metal may have improved charging characteristics. When the metal that may form a lithium compound at a potential higher than the potential of the anode active material and lithium is, for example, bismuth, and the anode active material is graphite, the intercalation process of lithium into an anode may include a formation of a solid solution alloy of bismuth and lithium or an intermetallic compound between the metals, such as $BiLi$ or $BiLi_3$, and then lithium intercalation into graphite through these solid solution or intermetallic compound.

Here, bismuth forms a lithium compound at a potential higher than a potential of the anode active material and lithium, and thus, even though the redox potentials of lithium and graphite are similar, deposition of dendrites may be suppressed and a battery including bismuth may have improved charging characteristics.

For example, when the metal that may form a lithium compound at a potential higher than a potential of the anode active material and lithium is antimony, and the anode active material is graphite, the intercalation process of lithium into an anode may include a formation of a solid solution alloy of antimony and lithium or an intermetallic compound between the metals, such as $SbLi$ or $SbLi_3$, and then lithium intercalation into graphite may occur through the solid solution or the intermetallic compound.

For example, when the metal that may form a lithium compound at a potential higher than a potentials of the anode active material and lithium is indium, and the anode active material is graphite, the intercalation process of lithium into an anode may include a formation of a solid solution alloy of indium and lithium or a intermetallic compound between the metals, such as $InLi$, and then lithium intercalation into graphite through the solid solution or intermetallic compound may occur.

For example, in the lithium ion secondary battery, a reaction potential of an electrochemical reaction of a metal or a metal compound with lithium ions may be 0.1 volts (V) or higher verses lithium metal. For example, in the lithium ion secondary battery, a reaction potential of an electrochemical reaction of a metal or a metal compound with lithium ions may be 0.2 V or higher verses lithium metal. For example, in the lithium ion secondary battery, a reaction potential of an electrochemical reaction of a metal or a metal compound with lithium ions may be 0.5 V or higher verses lithium metal. For example, in the lithium ion secondary battery, a reaction potential of an electrochemical reaction of a metal or a metal compound with lithium ions may be 0.6 V or higher verses lithium metal. When a reaction potential of an electrochemical reaction of a metal or a metal compound with lithium ions is 0.1 V or higher, dendrite formation on a surface of the anode active material may be suppressed.

In this regard, as used herein, the term "an electrochemical reaction with lithium ions" refers to, for example, an intercalation reaction of lithium ions into graphite. Further, as used herein, when a surface of graphite is coated with a soft metal, such as bismuth, an adhesive strength to the anode active material is improved through a roll-pressing process using, such as a roll-press, which results a decrease in an interface resistance, and thus cycle characteristics of the battery may improve.

Discharge characteristics of graphite include discharging ability at an almost flat voltage plateau from an initial stage to a terminal stage of the discharging, and a slope of the voltage decrease is steep during the terminal stage of the discharging. Further, in the case of hard carbon, a voltage constantly decreases until a discharge cut-off voltage. A capacity of a battery may be directly and accurately determined by measuring a voltage of the hard carbon, but a battery voltage is not stable when the hard carbon is used. Whereas, graphite may not be used to measure a battery capacity at a battery voltage due to a small voltage change, but a battery is relatively stable until a terminal stage of discharging, and thus a high voltage may be maintained. However, when graphite is used, since a slope of the voltage decrease during the terminal stage of discharging is steep, measuring a battery capacity from a battery voltage is difficult in principle, and there is a risk that the battery may become a discharged state. To date, a lower limit voltage of an anode has been estimated by measuring a voltage change of a cathode, but a state of the anode has not been directly detected.

According to the electrochemical reaction, for initiating deintercalation of lithium from the bismuth-lithium compounds just before discharging, there is a point of time where a rate of a voltage decrease is reduced during the terminal stage of discharging. In a discharge curve, since the point of time appears as an inflection point, the inflection point may be detected by measuring a change in battery voltage, and then the discharging of the battery may be ceased so that the battery may not reach a fully or over-discharged state. Further, a location of the inflection point may vary due to deterioration of cycles of the anode, and thus a lifespan of the anode of the lithium ion battery may be evaluated or determined based on the detected inflection point.

Figure 1:
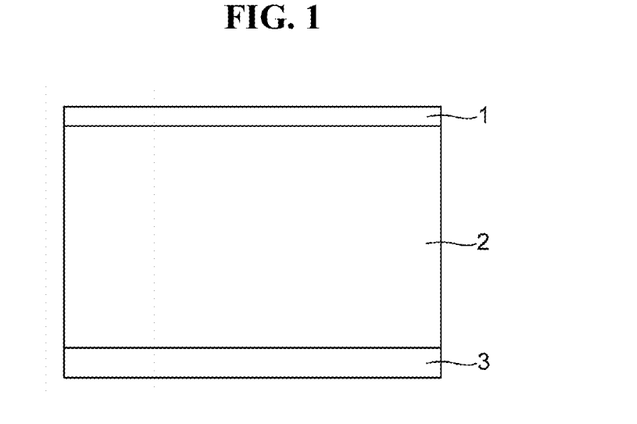
FIG. 1 is a cross-sectional view of an embodiment of a lithium ion secondary battery.

Referring to FIG. 1, a structure of a solid battery will be described. The solid battery includes a cathode layer 1, an electrolyte layer 2, and an anode layer 3.

Cathode Layer

The cathode layer 1 includes a sulfide-based solid electrolyte, a cathode active material, and a cathode layer conducting material. At least a part of a surface of the cathode active material is coated with a lithium ion conducting material, for example, a coating layer formed of $Li_2O$—$ZrO_2$. The lithium ion conducting material may be electrochemically inert with respect to an electrode reaction of the lithium battery. In the all-solid lithium ion secondary battery including the sulfide-based solid electrolyte, an output of the battery may deteriorate since an interface resistance increases due to a reaction at an interface between the cathode active material and the sulfide-based solid electrolyte. However, when the surface of the cathode active material is coated with the coating layer formed of $Li_2O$—$ZrO_2$, the coating layer may block direct contact between particles of the solid electrolyte included in the solid electrolyte layer 2 and the cathode active material, and thus formation of resistance components at the interface between the cathode active material and the solid electrolyte becomes difficult. Further, when the surface of the cathode active material is coated with the coating layer formed of $Li_2O$—$ZrO_2$, a decrease in a concentration of lithium/phosphorus at the interface of the cathode active material and the solid electrolyte is suppressed, and pathways for lithium ions to move may be formed. Thus, an increase in resistance at the interface of the cathode active material and the solid electrolyte may be suppressed. Therefore, the lithium battery may have good rate characteristics and cycle characteristics.

Since $Li_2O$—$ZrO_2$ is chemically stable, direct contact between the cathode active material and the solid electrolyte may be prevented when the surface of the cathode active material is coated with $Li_2O$—$ZrO_2$, and thus a reaction at the interface of the cathode active material and the solid electrolyte may be suppressed, and this results in suppressing production of resistant components. Further, at least a part of the surface of the cathode active material may be coated with the coating layer, in other words, the entire surface of the cathode active material may be coated with the coating layer, or the surface of the cathode active material may be partially coated with the coating layer.

As used herein, with respect to the cathode, the term "coating" denotes that a state of $Li_2O$—$ZrO_2$ disposed on a surface of a particle of the cathode active material is maintained in a non-moving manner, i.e., the coating is maintained to be directly in contact on the surface. Also, the coating layer coating the surface of the particle of the cathode active material has lithium ion conductivity and may maintain a layered form that does not moves even when in contact with the cathode active material and the solid electrolyte.

The cathode active material included in the cathode layer 1 may be any suitable material capable of reversibly intercalating and deintercalating lithium ions, and examples of the material may include lithium cobalt oxide, lithium nickel oxide, lithium nickel cobalt aluminum oxide, lithium nickel cobalt manganese oxide, lithium manganese oxide, lithium manganese oxide, lithium iron phosphate, nickel sulfide, copper sulfide, sulfur, iron oxide, and vanadium oxide.

These cathode active materials can be used alone or as a combination of at least two selected therefrom.

For example, the cathode active material may be at least one composite oxide of lithium and a metal selected from cobalt, manganese, nickel, and a combination thereof. For example, the cathode active material may be a compound represented by one of the following formulae: $Li_aA_{1-b}B'_bD'_2$ (where $0.90 \leq a \leq 1.8$, and $0 \leq b \leq 0.5$); $Li_aE_{1-b}B'_bO_{2-c}D'_c$ (where $0.90 \leq a \leq 1.8$, $0 \leq b \leq 0.5$, $0 \leq c \leq 0.05$); $LiE_{2-b}B'_bO_{4-c}D'_c$ (where $0 \leq b \leq 0.5$, and $0 \leq c \leq 0.05$); $Li_aNi_{1-b-c}Co_bB'_cD'_\alpha$ (where $0.90 \leq a \leq 1.8$, $0 \leq b \leq 0.5$, $0 \leq c \leq 0.05$, and $0 < \alpha \leq 2$); $Li_aNi_{1-b-c}Co_bB'_cO_{2-\alpha}F'_\alpha$ (where $0.90 \leq a \leq 1.8$, $0 \leq b \leq 0.5$, $0 \leq c \leq 0.05$, and $0 < \alpha < 2$); $Li_aNi_{1-b-c}Co_bB'_cO_{2-\alpha}F'_2$ (where $0.90 \leq a \leq 1.8$, $0 \leq b \leq 0.5$, $0 \leq c \leq 0.05$, and $0 < \alpha < 2$); $Li_aNi_{1-b-c}Mn_bB'_cD'_\alpha$ (where $0.90 \leq a \leq 1.8$, $0 \leq b \leq 0.5$, $0 \leq c \leq 0.05$, and $0 < \alpha < 2$); $Li_aNi_{1-b-c}Mn_bB'_cO_{2-\alpha}F'_\alpha$ (where $0.90 \leq a \leq 1.8$, $0 \leq b \leq 0.5$, $0 \leq c \leq 0.05$, and $0 < \alpha < 2$); $Li_aNi_{1-b-c}Mn_bB'_cO_{2-\alpha}F'_2$ (where $0.90 \leq a \leq 1.8$, $0 \leq b \leq 0.5$, $0 \leq c \leq 0.05$, and $0 < \alpha < 2$); $Li_aNi_bE_cG_dO_2$ (where $0.90 \leq a \leq 1.8$, $0 \leq b \leq 0.9$, $0 \leq c \leq 0.5$, and $0.001 \leq d \leq 0.1$); $Li_aNi_bCo_cMn_dGeO_2$ (where $0.90 \leq a \leq 1.8$, $0 \leq b \leq 0.9$, $0 \leq c \leq 0.5$, $0 \leq d \leq 0.5$, and $0.001 \leq e \leq 0.1$); $Li_aNiG_bO_2$ (where $0.90 \leq a \leq 1.8$, and $0.001 \leq b \leq 0.1$); $Li_aCoG_bO_2$ (where $0.90 \leq a \leq 1.8$, and $0.001 \leq b \leq 0.1$); $Li_aMnG_bO_2$ (where $0.90 \leq a \leq 1.8$, and $0.001 \leq b \leq 0.1$); $Li_aMn_2G_bO_4$ (where $0.90 \leq a \leq 1.8$, and $0.001 \leq b \leq 0.1$); $QO_2$; $QS_2$; $LiQS_2$; $V_2O_5$; $LiV_2O_5$; $LiI'O_2$; $LiNiVO_4$; $Li_{(3-f)}J_2(PO_4)_3$ (where $0 \leq f \leq 2$); $Li_{(3-f)}Fe_2(PO_4)_3$ (where $0 \leq f \leq 2$); and $LiFePO_4$.

In the formulae above, A may be selected from the group consisting of nickel (Ni), cobalt (Co), manganese (Mn), and combinations thereof; B' may be selected from the group consisting of aluminum (Al), nickel (Ni), cobalt (Co), manganese (Mn), chromium (Cr), iron (Fe), magnesium (Mg), strontium (Sr), vanadium (V), a rare earth element, and combinations thereof; D' may be selected from the group consisting of oxygen (O), fluorine (F), sulfur (S), phosphorus (P), and combinations thereof; E may be selected from the group consisting of cobalt (Co), manganese (Mn), and combinations thereof; F' may be selected from the group consisting of fluorine (F), sulfur (S), phosphorus (P), and combinations thereof; G is selected from the group consisting of aluminum (Al), chromium (Cr), manganese (Mn), iron (Fe), magnesium (Mg), lanthanum (La), cerium (Ce), strontium (Sr), vanadium (V), and combinations thereof; Q may be selected from the group consisting of titanium (Ti), molybdenum (Mo), manganese (Mn), and combinations thereof; I' may be selected from the group consisting of chromium (Cr), vanadium (V), iron (Fe), scandium (Sc), yttrium (Y), and combinations thereof; and J may be selected from the group consisting of vanadium (V), chromium (Cr), manganese (Mn), cobalt (Co), nickel (Ni), copper (Cu), and combinations thereof.

Among the examples of the cathode active material, the cathode active material may be a lithium transition metal oxide having a layered rock-salt structure. Examples of the lithium transition metal oxide having a layered rock-salt structure may be a ternary system that is represented by $LiNi_xCo_yAl_zO_2$ or $LiNi_xCo_yMn_zO_2$ (where, $0 < x < 1$, $0 < y < 1$, $0 < z < 1$, and $x+y+z=1$).

The compounds listed above as cathode active materials may have a coating layer on surfaces thereof. Alternatively, a mixture of a compound without a coating layer and a compound having a coating layer may be used. The coating layer may include at least one compound of a coating element selected from the group consisting of oxide, hydroxide, oxyhydroxide, oxycarbonate, and hydroxycarbonate of the coating element. The compounds for the coating layer may be amorphous or crystalline. The coating element for the coating layer may be magnesium (Mg), aluminum (Al), cobalt (Co), potassium (K), sodium (Na), calcium (Ca), silicon (Si), titanium (Ti), vanadium (V), tin (Sn), germanium (Ge), gallium (Ga), boron (B), arsenic (As), zirconium (Zr), or mixtures thereof. The coating layer may be formed using any method that does not adversely affect the physical properties of the cathode active material (e.g., a spray coating method or a dipping method) when a compound of the coating element is used. This will be obvious to those of ordinary skill in the art, and thus a detailed description thereof will be omitted.

Examples of the cathode layer conducting material may include graphite, carbon black, acetylene black, Ketjen black, carbon fibers, and metal powder.

The cathode layer 1 may further include a solid electrolyte. The solid electrolyte of the cathode layer may be any solid electrolyte commonly known in the art. In particular, examples of the solid electrolyte may include $Li_3N$, LISICON, lithium phosphate oxynitride (LIPON), $Li_{3.25}Ge_{0.25}P_{0.75}S_4$ (Thio-LISICON), $Li_2O$—$Al_2O_3$—$TiO_2$—$P_2O_5$ (LATP). Further, examples of the solid electrolyte having a high ion conductivity may include $Li_2S$—$P_2S_5$, $Li_3PS_4$, $Li_7P_3S_{11}$, $Li_6PS_5Cl$, and $Li_3PO_4$.

An ion conductivity of $Li_3PO_4$ is in a range of about $10^{-4}$ S/cm to about $10^{-3}$ S/cm. An ion conductivity of $Li_7P_3S_{11}$ is in a range of about $10^{-3}$ S/cm to about $10^{-2}$ S/cm. An ion conductivity of $Li_6PS_5Cl$ is in a range of about $10^{-4}$ S/cm to about $10^{-3}$ S/cm. An ion conductivity of $Li_3PO_4$ is in a range of about $10^{-5}$ S/cm to about $10^{-4}$ S/cm.

An amount of the cathode active material may be in a range of about 40 parts to about 99 parts by weight, or, for example, about 50 parts to about 95 parts by weight, based on 100 parts by weight of the cathode layer 1. An amount of the solid electrolyte may be in a range of about 1 part to about 50 parts by weight, for example, about 1 part to about 45 parts by weight, or, for example, about 5 parts to about 40 parts by weight, based on 100 parts by weight of the cathode layer 1. An amount of the conducting material may be in a range of about 0.05 part to about 10 parts by weight, for example, about 0.4 part to about 9 parts by weight, for example, about 0.5 part to about 8 parts by weight, or, for example, about 0.5 part to about 6 parts by weight, based on 100 parts by weight of the cathode layer 1. When the amounts of the cathode active material, the solid electrolyte, and the conducting material in the cathode layer 1 are within these ranges above, the cathode layer 1 may have good ion conductivity and low resistance.

Electrolyte Layer

The electrolyte layer 2 includes a sulfide-based solid electrolyte. The sulfide-based solid electrolyte includes at least lithium (Li) as a first component and phosphorus (P) and sulfur (S) as a second component. The sulfide-based solid electrolyte may be obtained, for example, by melt-mixing $Li_2S$ and $P_2S_5$ at a predetermined ratio by heating $Li_2S$ and $P_2S_5$ at a temperature of the melting points of $Li_2S$ and $P_2S_5$ or higher; maintaining the mixture at the temperature for a predetermined time, and rapidly cooling the mixture (melting-rapid cooling method). Alternatively, the sulfide-based solid electrolyte may be obtained by mechanically treating $Li_2S$—$P_2S_5$ by a method such as a mechanical milling.

Further, the amorphous resultant thus obtained may be crystallized by heat-treatment to improve an ion conductivity of the sulfide-based solid electrolyte. When the solid electrolyte is a sulfide-based solid electrolyte formed of $Li_2S$—$P_2S_5$, a lithium ion conductivity of the amorphous resultant may be $10^{-4}$ $Scm^{-1}$. A lithium ion conductivity of the crystalline resultant may be $10^{-3}$ $Scm^{-1}$.

The inorganic solid electrolyte may be an inorganic solid electrolyte commonly known in the art suitable for a lithium ion battery. Examples of the inorganic solid electrolyte may include an oxide-based inorganic solid electrolyte and a phosphate-based inorganic solid electrolyte in addition to a sulfide-based inorganic solid electrolyte. The inorganic solid electrolyte commonly known in the art is the same as defined in the description of the cathode layer 1.

Anode Layer

The anode layer 3 may include a sulfide-based solid electrolyte and a carbonaceous material as an anode active material, and examples of the carbonaceous material may include graphite, for example, artificial graphite, natural graphite, a mixture of artificial graphite and natural graphite, and natural graphite coated with artificial graphite. Further, examples of the carbonaceous material may include amorphous carbon, for example, hard carbon. Further, the anode active material may be any anode active material capable of intercalating and deintercalating lithium ions, and the anode active material may be graphite, a tin material, a silicon material, or a composite of tin-silicon material and graphite.

An element coated on a surface of the anode active material may be a metal capable of forming a lithium compound with the anode active material at a potential higher than that of a compound formed by the anode active material and lithium. Examples of the metal may include at least one selected from the group consisting of aluminum (Al), silicon (Si), titanium (Ti), zirconium (Zr), niobium (Nb), germanium (Ge), gallium (Ga), silver (Ag), indium (In), tin (Sn), antimony (Sb), and bismuth (Bi), an alloy of at least two metals, a lithium compound formed with at least one element selected from the group, and an oxide of at least one metal selected from the group. Examples of the metal may be bismuth and antimony.

As the anode active material, graphite that is vacuum-dried at a temperature of 80° C. for 24 hours is prepared. Bismuth, as one of elements that form a lithium compound at a potential higher than that of a graphite-lithium interlayer compound with respect to a redox potential of lithium, is coated on a surface of the graphite. Bismuth is smooth and may firmly adhere onto a graphite surface by using a dry particle composite method (collision between bismuth particles and graphite surface). Also, bismuth may be easily deformed when an electrode is roll-pressed during the last pressing process in the preparation of a battery. As the coating element, bismuth particles (having an average particle diameter of 0.7 micrometers, (μm)) were evenly adhered onto a surface of particles (having an average particle diameter of 10 μm) at a ratio of 1 weight percent (wt %) by using a dry particle composite method. The dry particle composite method is a method that adheres fine particles onto mother particles while individually and evenly applying impact, compressive, and shear forces on the particles by rotating a rotor having a particular shape at a high peripheral speed of 40 m/s or higher in a horizontal cylindrical mixture container. The graphite may be coated with bismuth by using a dry particle composite device that is commercially available. In some exemplary embodiments, the metal coating may be performed by plating, depositing, or sputtering. The coating layer may be formed as a thin layer on the entire surface of the anode active material so that the coating reaction may be quickly and homogenously carried out. In terms of an energy density by weight, an amount of the coating may be small (e.g., in a range of about 0.1 wt % to about 5 wt %). Further, when the anode active material and a surface of the coating layer are firmly attached, the coating metal may not be easily detached from the graphite surface. In this regard, the coating may be performed in the dry particle composite device at a high-speed rotation and for a long period of time.

The anode layer 3 may further include a solid electrolyte and a conducting material.

Examples of the solid electrolyte and the conducting material may be the same as defined in connection with the cathode layer.

Method of Preparing Lithium Ion Secondary Battery

The structure of the all-solid lithium ion battery according to an exemplary embodiment is as described above, and a method of preparing the lithium ion battery will be described hereinafter. The lithium ion battery is manufactured by preparing a cathode layer 1, an anode layer 3, and a solid electrolyte layer 2 and then stacking the layers. Each process will be described in detail below.

Preparation of Cathode Layer 1

The cathode layer 1 is prepared as follows. For example, the cathode layer 1 may be obtained by adding a mixture of the cathode active material coated with $aLi_2O$—$ZrO_2$ ($0.1 \leq a \leq 2.0$), a sulfide-based solid electrolyte, and a conducting material and a binder into a solvent, such as an organic solvent, to prepare a slurry or a paste, coating the slurry or the paste on a current collector by using a doctor blade, drying the resultant and roll-pressing the dried-resultant with a roll-press. Here, examples of the current conductor may include SUS, aluminum, nickel, iron, titanium, and carbon, and, particularly, aluminum may be used as the current conductor. Further, a powder mixture including the cathode active material coated with $aLi_2O$—$ZrO_2$ (0.1-a-2.0), the sulfide-based solid electrolyte, and the conducting material may be roll-pressed into a pallet and may be used as the cathode layer 1 without using the current collector and the binder.

Preparation of Anode Layer 3

The anode layer 3 is prepared as follows. For example, the anode layer 3 may be obtained by adding a mixture of the anode active material coated with bismuth, a sulfide-based solid electrolyte, and a conducting material and a binder into a solvent, such as an organic solvent, to prepare a slurry or a paste, coating the slurry or the paste on a current collector by using a doctor blade, drying the resultant and roll-pressing the dried-resultant with a roll-press. Here, examples of the current conductor may include SUS, copper, nickel, and carbon, and, particularly, nickel may be used as the current conductor. Further, a powder mixture including the anode active material coated with bismuth, the sulfide-based solid electrolyte, and the conducting material may be roll-pressed into a pallet and may be used as the anode layer 3 without using the current collector and the binder.

Preparation of Electrolyte Layer 2

The solid electrolyte layer 2 is prepared as follows. A method of preparing a sulfide-based solid electrolyte used as a solid electrolyte may include a melting-rapid cooling method or a mechanical milling method. In the melting-rapid cooling method, predetermined amounts of $Li_2S$ and $P_2S_5$ are mixed and prepared into a pallet, and the pallet was allowed to react in a vacuum state at a predetermined reaction temperature and rapidly cooled to obtain a sulfide-based solid electrolyte. Here, the reaction temperature may be in a range of about 400° C. to about 1000° C., or, for example, about 800° C. to about 900° C. Further, a period of time for the reaction may be in a range of about 0.1 hour to about 12 hours, or, for example, about 1 hour to about 12 hours. Furthermore, the temperature for rapidly cooling the resultant may be about 10° C. or lower, or, for example 0° C. or lower, and the cooling speed may be in a range of about 1 Kelvin per second (K/sec) to about 10000 K/sec, or, for example, about 1 K/sec to about 1000 K/sec.

In the mechanical milling method, predetermined amounts of $Li_2S$ and $P_2S_5$ are reacted for a predetermined period of time by using a mechanical milling method to obtain a sulfide-based solid electrolyte. The mechanical milling method using these raw materials may allow the reaction at room temperature. According to the mechanical milling method, the solid electrolyte may be prepared at room temperature, and thus the raw materials are not thermally decomposed and a ratio of amounts of the raw materials may be maintained in the solid electrolyte. A rotation speed and a period of time for rotation of the mechanical milling method are not particularly limited, but the production rate of the solid electrolyte increases as the rotation speed increases, and a conversion ratio of the raw materials to the solid electrolyte increases as the period of time for rotation increases. Subsequently, the solid electrolyte thus obtained may be thermally treated and pulverized to be used as a solid electrolyte in the form of particles.

The fine particles of the solid electrolyte thus prepared may be used to form a layer by using, for example, an aerosol deposition method, a sputtering method, or a spray method, which are a layer-forming methods known in the art, and thus the solid electrolyte layer 3 may be prepared. Further, a layer-forming method including coating a solution prepared by mixing a solid electrolyte, a solvent, and a binder; and removing a solvent may be used. Alternatively, the layer may be formed by pressing the solid electrolyte itself or an electrolyte prepared by mixing the solid electrolyte and a binder or a support (a material or a compound that enhances strength of the solid electrolyte layer 3 and prevents short-cut of the solid electrolyte itself).

Stacking and Attaching Each of Layers

The cathode layer 1, the solid electrolyte layer 2, and the anode layer 3 prepared as described above are stacked and pressed while having the solid electrolyte layer 2 sandwiched between the cathode layer 1 and the anode layer 3, thereby completing manufacture of the lithium ion battery according to an exemplary embodiment. Further, the stack may be heated while being pressed to further strengthening adhesion between the layers.

In a discharge curve, the lithium ion secondary battery may include a point of inflection of a discharge curve that occurs during a rapid voltage decrease in a domain of a discharge capacity higher than 75%. A discharge capacity of the secondary battery including a coated anode active material may increase about 50% or higher, for example, about 60% or higher, for example, about 70% or higher, for example, about 80% or higher, for example, about 90% or higher, or, for example, about 100% or higher, compared to a discharge capacity of the secondary battery including a non-coated anode active material.

Battery Evaluation

Example 1

A cathode active material was prepared as follows. A lithium methoxide and a zirconium (IV) propoxide were mixed with a mixed solvent including ethanol, ethyl acetoacetate, and water for 30 minutes. Then, a $LiNiCoAlO_2$ ternary powder ($LiNi_{0.8}Co_{0.15}Al_{0.05}O_2$), as a cathode active material, was added to the mixture so that a coating amount of $aLi_2O$—$ZrO_2$(a=1) was 0.5 mol %, and the mixture was heated to a temperature of 40° C. while stirring to evaporate-dried the solvent. Here, the mixture was treated with ultrasound waves. Further, a precursor of $Li_2O$—$ZrO_2$ included in a surface of the cathode active material was heat-treated at a temperature of 300° C. for 2 hours to obtain a LiNi-CoAlO$_2$ ternary powder coated with 0.5 mol % of $Li_2O$—$ZrO_2$ on a surface thereof.

An anode active material was prepared as follows. Graphite was vacuum-dried at a temperature of 80° C. for 24 hours. Bismuth, which is one of elements that form a lithium compound at a potential higher with respect to a redox potential of lithium than a potential for a graphite-lithium interlayer compound, was coated on a surface of the graphite. The coating process was performed by a dry particle composite method, where particles of bismuth (having an average particle diameter of 0.7 μm), as a coating element, were evenly fixed on a surface of the graphite (having an average particle diameter of 10 μm) at a ratio of 1 wt %.

Figure 2A:
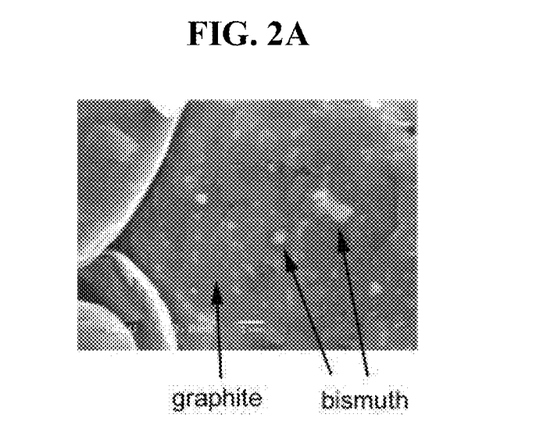
FIG. 2A is an electron microscope image of an anode active material including graphite coated with bismuth.
Figure 2B:
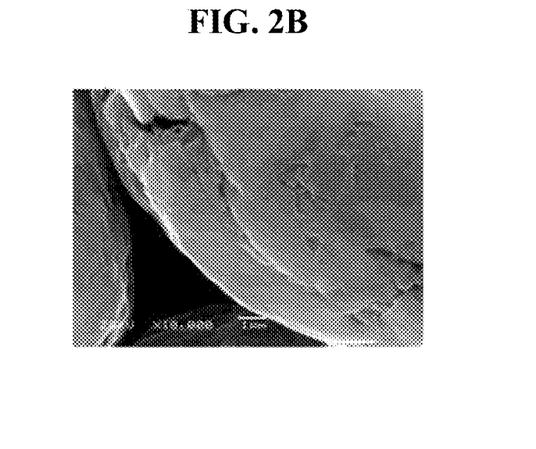
FIG. 2B is an electron microscope image of an anode active material including graphite that is not coated with bismuth.

Conditions of a dry particle composite device included a rate of 5000 rpm and a period of time of 30 minutes. FIG. 2A is an electron microscope image (×10000) of a surface of the graphite coated with bismuth, and FIG. 2B is an electron microscope image (×10000) of a surface of the graphite that is not coated with bismuth. Further, a mechanically milled solid electrolyte, $Li_2S$—$P_2S_5$ (80-20 mol %), was prepared.

The surface-coated cathode or anode prepared as described above; a solid electrolyte; and a vapor growth carbon fiber (VGCF), which is a conducting material, were mixed at a ratio of 60/35/5 wt %, and this was used as a cathode mixture or an anode mixture, respectively. 15 milligrams (mg) of the cathode mixture or anode mixture was respectively disposed, and 70 mg of the solid electrolyte was interposed therebetween, and the stack was pressed at a pressure of 3 tons per square centimeter (t/cm$^2$) to prepare a pellet. The pallet was used as a cell for the test.

Figure 3A:
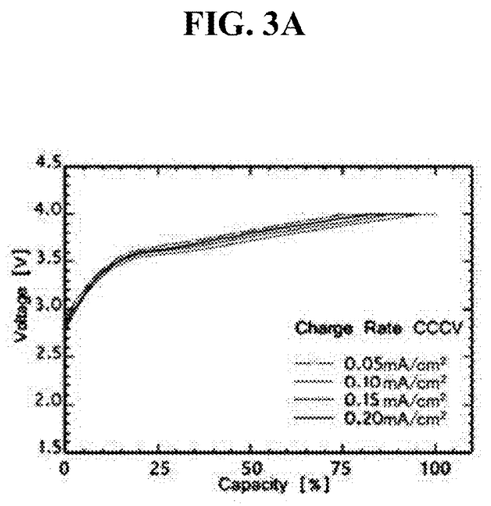
FIG. 3A is graph of voltage (volts, V) versus capacity (percent, %) and is a charge curve of a lithium ion secondary battery of Example 1 including an anode active material including graphite coated with bismuth.
Figure 3B:
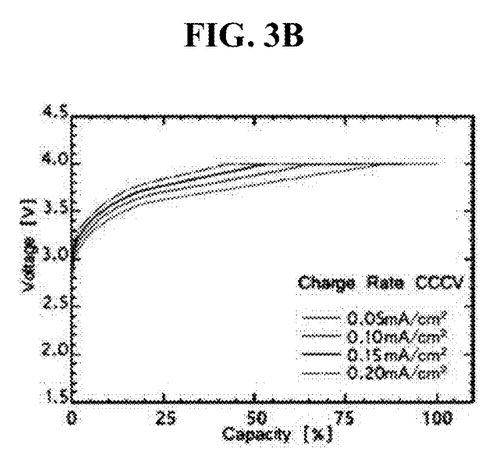
FIG. 3B is graph of voltage (volts, V) versus capacity (percent, %) and is a charge curve of a lithium ion secondary battery of Example 1 including the anode active material including graphite that is not coated with bismuth.

A charging evaluation was performed on the cell for test thus prepared by changing a current density in a range of about 0.05 milliamperes per square centimeter (mA/cm$^2$) to about 0.20 mA/cm$^2$ with a charging/discharging testing device (TOSCAT-3100, available from Dongyang System) in a constant-temperature bath of 25° C. (see FIG. 3A). As a comparative example, a charging/discharging evaluation was performed on a solid battery using an anode active material that is not coated with bismuth (see FIG. 3B). FIGS. 3A and 3B are a charge curve. As shown in FIGS. 3A and 3B, the solid battery including an anode active material coated with bismuth was charged to a high capacity, and thus it may be known that a charging property of the solid battery including an anode active material coated with bismuth was significantly improved.

Example 2

Figure 4A:
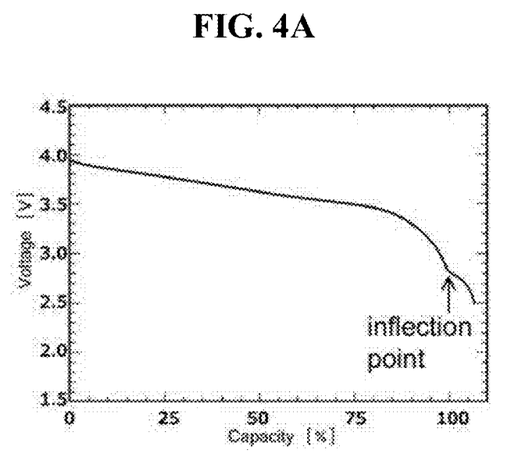
FIG. 4A is graph of voltage (volts, V) versus capacity (percent, %) and is a discharge curve of a lithium ion secondary battery of Example 2 including the anode active material including graphite coated with bismuth.
Figure 4B:
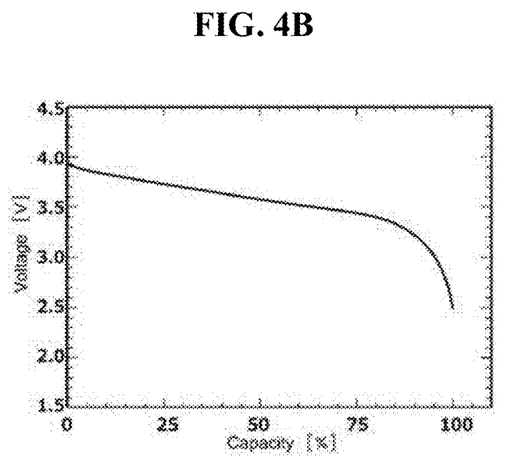
FIG. 4B is graph of voltage (volts, V) versus capacity (percent, %) and is a discharge curve of a lithium ion secondary battery of Example 2 including the anode active material including graphite that is not coated with bismuth.

An initial battery capacity of the cell prepared according to an exemplary embodiment was charged/discharged at a current density of 0.05 mA/cm$^2$ in a constant-temperature bath of 25° C. Then, after 100 cycles of the charging/discharging, the cell was discharged at a current density of 0.05 mA/cm$^2$ in a specified capacity. FIGS. 4A and 4B are a charge curve of an anode. The cell including an anode active material coated with bismuth (FIG. 4A) had a point of inflection in the middle of the discharge curve to form a lithium compound at a potential that is higher that a redox potential of the anode active material and lithium, whereas the cell including an anode active material that is not coated with bismuth (FIG. 4B) did not have a point of inflection.

In the solid battery prepared according to an exemplary embodiment, the discharging of the battery was ceased when the point of inflection appeared, and thus the discharging of the battery was suppressed. However, the solid battery of the comparative example did not have a point of inflection, and thus it was difficult to cease the discharging just before a low voltage. In a lithium ion battery, a lower limit of a voltage varies due to deterioration of the charging/discharging cycle, and thus the discharging of the battery may not be ceased just before the lower limit of a voltage. When an anode active material is coated with bismuth, a point of inflection moves as a correlation curve between the number of cycles and a capacity by repeating the charging/discharging cycles. Thus, the deterioration of an anode may be determined according to the point of inflection. In this regard, since the discharging of the battery may be suppressed and deterioration of an anode may be determined by coating the anode active material with bismuth, bismuth is classified as a marker element for a total management of a lithium ion battery.

Further, a remaining capacity of a battery may be accurately detected by using an anode active material coated with bismuth. When it is premised that a conventional battery is not deteriorated, an operation lower limit voltage for stopping a device may be determined to be, for example, 3 V, and then the remaining capacity of the battery may be displayed. That is, a cut-off voltage has been set somewhat higher in view of voltage tolerances of circuits and hardware included in the device. In this regard, when a discharge voltage decreased as the battery deteriorated and the internal impedance increased, the device has been stopped even though the battery has remained capacity, and thus some capacity of the battery was remained unused. However, since the remaining capacity of the battery may be accurately detected at a point of inflection, even when a battery capacity is decreased, by coating the anode active material with bismuth, the battery may be used without wasting any unused capacity thereof by lowering a lower limit of operating voltage.

Example 3

Figure 5:
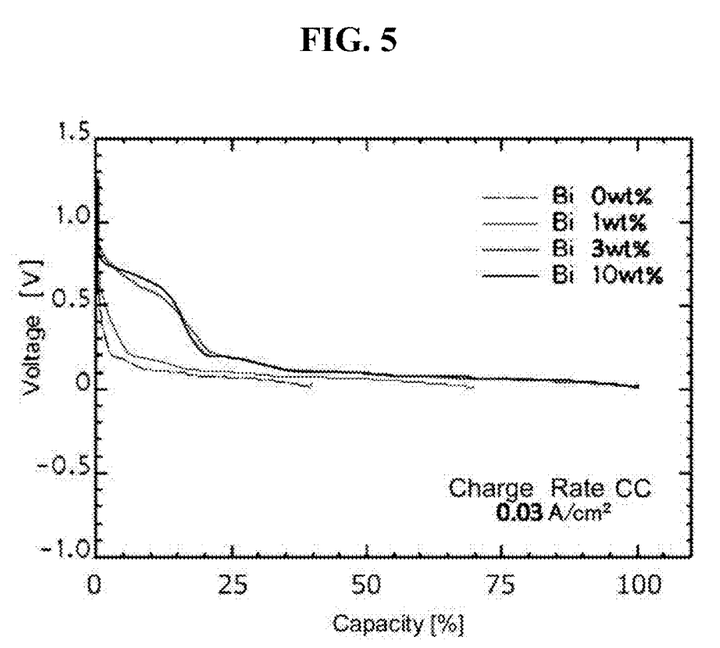
FIG. 5 is graph of voltage (volts, V) versus capacity (percent, %) and is a discharge curve of a lithium ion secondary battery of Example 3.

Graphite (the anode) with a varied amount of bismuth for the coating was prepared in the same manner described above. The amount of the coating was varied into non-coating, 1 wt %, 3 wt %, and 10 wt % of coating. FIG. 5 is an initial discharge curve using a lithium-indium alloy as a counter electrode. The anode was charged at a current density of 0.03 mA/cm$^2$ in a constant-temperature bath of 25° C. A relationship between an initial battery capacity and a voltage according to the amount of the bismuth coating was confirmed as shown in FIG. 5. Further, the solid electrolyte was removed, and a relationship between an added amount of bismuth and an amount of charging of the anode was clarified by performing the battery evaluation in conditions that is relatively difficult to intercalate lithium into an anode. Referring to FIG. 5, when the amount of the bismuth coating increased, a battery capacity increased accordingly.

As described above, according to the one or more of the above exemplary embodiments of the present inventive concept, a lithium secondary battery may suppress deposition of dendrites and implement high charging characteristics regardless of an anode active material. Also, provided is a lithium ion battery capable of suppressing deposition of dendrites and implementing high charging characteristics as well as directly detecting a charge/discharge state of an anode without relying on information of pressure sensors.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A lithium ion secondary battery comprising:
   a cathode layer;
   an anode layer comprising a solid electrolyte, an anode active material and a coating comprising a metal element, wherein the coating is disposed on the anode active material, and wherein the metal element is at least one of aluminum, titanium, zirconium, niobium, germanium, gallium, silver, indium, tin, antimony, and bismuth; and
   a solid electrolyte layer disposed between the cathode layer and the anode layer,
   wherein the coating has an electrochemical reaction potential with lithium that is greater than an electrochemical reaction potential of the anode active material with lithium.

2. The lithium ion secondary battery of claim 1, wherein the anode active material is a carbonaceous material.

3. The lithium ion secondary battery of claim 1,
   wherein the anode active material is graphite, and
   wherein the electrochemical reaction between the anode active material and the lithium comprises an intercalation reaction of lithium ions into the graphite.

4. The lithium ion secondary battery of claim 1, wherein the coating comprises a metal of the metal element, a compound comprising the metal element, an alloy comprising the metal element and a different metal, or a compound of the metal element and lithium.

5. The lithium ion secondary battery of claim 1, wherein the metal element is bismuth.

6. The lithium ion secondary battery of claim 1, wherein the coating comprises at least one selected from a Bi—Li solid solution alloy, a Sb—Li solid solution alloy, and an In—Li solid solution alloy.

7. The lithium ion secondary battery of claim 1, wherein the coating comprises at least one intermetallic compound selected from BiLi, BiLi$_3$, SbLi, SbLi$_3$, and InLi.

8. The lithium ion secondary battery of claim 1, wherein an amount of the coating is in a range of about 0.1 weight percent to about 5 weight percent, based on a total weight of the anode active material and the coating.

9. The lithium ion secondary battery of claim 1, wherein the electrochemical reaction potential of the coating with lithium is about 0.1 volts or greater, with respect to a lithium metal.

10. The lithium ion secondary battery of claim 1, wherein the electrochemical reaction potential of the coating with lithium is about 0.5 volts or greater, with respect to a lithium metal.

11. The lithium ion secondary battery of claim 1, wherein at least a portion of a surface of a cathode active material of the cathode layer comprises a lithium ion conducting material disposed thereon.

12. The lithium ion secondary battery of claim 11, wherein the lithium ion conducting material is Li$_2$O—ZrO$_2$.

13. The lithium ion secondary battery of claim 1, wherein the solid electrolyte layer comprises a sulfide solid electrolyte.

14. The lithium ion secondary battery of claim 13, wherein the solid electrolyte layer comprises lithium and wherein the sulfide solid electrolyte comprises phosphorus and sulfur.

15. The lithium ion secondary battery of claim 1, wherein the solid electrolyte layer comprises a solid electrolyte comprising Li$_2$S—P$_2$S$_5$.

16. The lithium ion secondary battery of claim 1, wherein in a graph of voltage versus discharge capacity, a discharge voltage of the lithium ion secondary battery comprises a point of inflection that occurs during a discharge of between 75 percent and 100 percent of a discharge capacity of the lithium ion secondary battery.

17. The lithium ion secondary battery of claim 1, wherein a discharge capacity of the lithium ion secondary battery comprising the coated anode active material is at least 50 percent greater than a discharge capacity of a lithium ion secondary battery comprising a non-coated anode active material.

18. A method of controlling discharge of a lithium ion secondary battery, the method comprising:
    monitoring a discharge curve of an anode;
    detecting, in a graph of voltage versus discharge capacity, a point of inflection of a discharge voltage that occurs during a discharge of between 75 percent and 100 percent of a discharge capacity of the anode; and
    completing the discharge of the anode based on the detection of the point of inflection to control the discharge of the lithium secondary battery, wherein the lithium ion secondary battery comprises
    a cathode layer,
    an anode layer comprising a solid electrolyte, an anode active material and a coating comprising a metal element, wherein the coating is disposed on the anode active material, and wherein the metal element is at least one of aluminum, titanium, zirconium, niobium, germanium, gallium, silver, indium, tin, antimony, and bismuth, and
    a solid electrolyte layer disposed between the cathode layer and the anode layer,
    wherein the coating has an electrochemical reaction potential with lithium that is greater than an electrochemical reaction potential of the anode active material with lithium.

19. A method of determining battery characteristics of a lithium ion secondary battery, the method comprising:
    monitoring a discharge curve of an anode;
    detecting, in a graph of voltage versus discharge capacity, a point of inflection of the discharge voltage that occurs during a discharge of between 75 percent and 100 percent of a discharge capacity of the anode; and
    determining a deterioration of the anode based on the detection of the point of inflection to determine battery characteristics of the lithium ion secondary battery, wherein the lithium ion secondary battery comprises
    a cathode layer,
    an anode layer comprising a solid electrolyte, an anode active material and a coating comprising a metal element, wherein the coating is disposed on the anode active material, and wherein the metal element is at least one of aluminum, titanium, zirconium, niobium, germanium, gallium, silver, indium, tin, antimony, and bismuth, and a solid electrolyte layer disposed between the cathode layer and the anode layer, wherein the coating has an electrochemical reaction potential with lithium that is greater than an electrochemical reaction potential of the anode active material with lithium.

* * * * *